US008604827B2

(12) United States Patent
Jeong et al.

(10) Patent No.: US 8,604,827 B2
(45) Date of Patent: Dec. 10, 2013

(54) LOGIC CIRCUIT, INTEGRATED CIRCUIT INCLUDING THE LOGIC CIRCUIT, AND METHOD OF OPERATING THE INTEGRATED CIRCUIT

(75) Inventors: Hyung-su Jeong, Suwon-si (KR);
Ho-jung Kim, Suwon-si (KR);
Hyun-sik Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 65 days.

(21) Appl. No.: 13/242,060

(22) Filed: Sep. 23, 2011

(65) Prior Publication Data

US 2012/0212255 A1    Aug. 23, 2012

(30) Foreign Application Priority Data

Feb. 21, 2011   (KR) .................. 10-2011-0015035

(51) Int. Cl.
*H03K 19/173*    (2006.01)
(52) U.S. Cl.
USPC ................... 326/38; 326/40; 326/41; 326/47; 365/148; 365/189.05; 365/189.08
(58) Field of Classification Search
USPC ........... 326/37–41, 47, 30; 365/148, 189.011, 365/189.08, 189.05, 189.06
See application file for complete search history.

(56) References Cited

U.S. PATENT DOCUMENTS

| 6,664,807 | B1* | 12/2003 | Crotty et al. .................... 326/40 |
| 7,782,108 | B2 | 8/2010 | Sedlak |
| 8,040,723 | B2* | 10/2011 | Sheu et al. ..................... 365/163 |
| 8,194,473 | B2* | 6/2012 | Shin et al. ................ 365/189.07 |
| 2008/0062739 | A1* | 3/2008 | Bill et al. ....................... 365/148 |
| 2008/0123389 | A1* | 5/2008 | Cho et al. ....................... 365/148 |
| 2008/0253219 | A1* | 10/2008 | Lee ........................... 365/230.06 |
| 2010/0027326 | A1* | 2/2010 | Kim et al. ..................... 365/163 |
| 2010/0103726 | A1* | 4/2010 | Bae et al. ...................... 365/163 |
| 2010/0124105 | A1* | 5/2010 | Wang et al. ................... 365/163 |

FOREIGN PATENT DOCUMENTS

| JP | 2008085770 A | 4/2008 |
| JP | 2009077059 A | 4/2009 |
| KR | 20050099259 A | 10/2005 |
| WO | WO-2009060625 A1 | 5/2009 |

\* cited by examiner

*Primary Examiner* — Jason M Crawford
(74) *Attorney, Agent, or Firm* — Harness, Dickey & Pierce, P.L.C.

(57) ABSTRACT

The logic circuit includes at least one variable resistance device configured such that a resistance value of the at least one variable resistance device varies according to at least one selected value. The selected value is selected from among a voltage and a current of an input signal, and the at least one variable resistance device is configured to memorize the resistance value. The logic circuit is configured to store multi-level data by setting the memorized resistance value.

30 Claims, 9 Drawing Sheets

LOGIC CIRCUIT, INTEGRATED CIRCUIT INCLUDING THE LOGIC CIRCUIT, AND METHOD OF OPERATING THE INTEGRATED CIRCUIT

CROSS-REFERENCE TO RELATED APPLICATIONS

This application claims priority under 35 U.S.C. §119 to Korean Patent Application No. 10-2011-0015035, filed on Feb. 21, 2011, in the Korean Intellectual Property Office (KIPO), the entire contents of which is incorporated herein by reference.

BACKGROUND

1. Field

The present disclosure relates to logic circuits, and more particularly, to a logic circuit including a variable resistance device, an integrated circuit including the logic circuit, and a method of operating the logic circuit.

2. Description of the Related Art

In general, a logic circuit includes a flip-flop or a latch to synchronize an input signal with a clock signal, thereby improving an operating speed of the logic circuit while reducing power consumption thereof. If a signal supplied to the logic circuit is a multi-bit signal, a large number of flip-flops or latches are needed to process bits included in the multi-bit signal. If a large number of flip-flops or latches are included in the logic circuit, the size of and power consumption in the logic circuit is relatively great.

SUMMARY

Provided are a logic circuit having a structure that is simplified so as to reduce the size and power consumption thereof, an integrated circuit including the logic circuit, and a method of operating the logic circuit.

Additional aspects will be set forth in part in the description which follows and, in part, will be apparent from the description, or may be learned by practice of the presented embodiments.

According to an example embodiment, a logic circuit includes at least one variable resistance device configured such that a resistance value of the at least one variable resistance device varies according to at least one selected value, the selected value being selected from among a voltage and a current of an input signal, the at least one variable resistance device being configured to memorize the resistance value. The logic circuit is configured to store multi-level data by setting the memorized resistance value.

The input signal may be a multi-bit signal.

The logic circuit may include a write unit including the at least one variable resistance device, the write unit being configured to write the multi-level data to the variable resistance device by setting the resistance value of the at least one variable resistance device based on the at least one selected value and a write enable signal; and a read unit configured to read the multi-level data corresponding to the set resistance value of the at least one variable resistance and a read enable signal.

The write unit may include a first write switch connected between a first power supply voltage terminal and a first node, and configured to be switched on according to an inverted signal of the write enable signal; a current supply unit connected between the first node and a second node, and configured to be switched on and to supply a write current to the second node based on the input signal; the at least one variable resistance device being connected between the second node and a third node; and a second write switch being connected between the third node and a ground voltage terminal, and switched on based on the write enable signal.

The read unit may be configured such that, if the read enable signal is activated, the read unit may read the multi-level data corresponding to the set resistance value of the at least one variable resistance device by sensing a voltage of the second node. The read unit may include a first read switch connected between a second power supply voltage terminal and a fourth node, and configured to be switched on according to an inverted signal of the read enable signal; a bias unit connected between the fourth node and the second node, and configured to be switched on and to supply a read current to the second node according to a bias signal; and a second read switch connected between the third node and the ground voltage terminal, and configured to be switched on according to the read enable signal.

The read unit may be configured such that if the read enable signal is activated, the read unit may read the multi-level data corresponding to the set resistance value of the at least one variable resistance device by sensing a voltage of the third node. The read unit may include a first read switch connected between a second power supply voltage terminal and the second node, and configured to be switched on according to an inverted signal of the read enable signal; a bias unit connected between the third node and a fourth node, and configured to be switched on and to supply a read current to the third node according to a bias signal; and a second read switch connected between the fourth node and the ground voltage terminal, and configured to be switched on according to the read enable signal.

The current supply unit may include a current supply switch, and the bias unit may include a bias switch. The current supply switch may be larger than the bias switch. The bias unit may include a bias switch. A size of the bias switch may be configured such that the bias switch does not to influence the set resistance value of the at least one variable resistance device.

The write unit may include an input signal receiving unit connected between a first power supply voltage terminal and a plurality of input nodes, the input signal receiving unit being configured to activate one of the plurality of input nodes according to the input signal; a first write switching unit connected between the plurality of input nodes and a ground voltage terminal, and configured to be switched on according to an inverted signal of the write enable signal; a current supply unit connected between a second power supply voltage terminal and a first node, the current supply unit configured to supply a write current to the first node based on an activated input node from among the plurality of input nodes; the at least one variable resistance device being connected between the first node and a second node; and a second write switch connected between the second node and the ground voltage terminal, and configured to be switched on according to the write enable signal.

The current supply unit may include a plurality of switches commonly connected to the second power supply voltage terminal, and configured to be switched on according to voltages of the plurality of input nodes, respectively; and a plurality of current adjustment devices connected in series to the plurality of switches, respectively, and configured to be switched on according to a first bias signal. Sizes of the plurality of current adjustment devices may be different from one another. The current supply unit may include a plurality of current adjustment devices commonly connected to the second power supply voltage terminal, and configured to be switched on according to voltages of the plurality of input nodes, respectively. Sizes of the plurality of current adjustment devices may be different from one another.

The read unit may be configured such that if the read enable signal is activated, the read unit may read the multi-level data corresponding to the set resistance value of the at least one variable resistance device by sensing a voltage of the first node. The read unit may include a first read switch connected between a third power supply voltage terminal and a third node, and configured to be switched on according to an inverted signal of the read enable signal; a bias unit connected between the third node and the first node, and configured to be switched on and to supply a read current to the first node according to a bias signal; and a second read switch connected between the second node and the ground voltage terminal, and configured to be switched on according to the read enable signal.

If the read enable signal is activated, the read unit may read the multi-level data corresponding to the set resistance value of the at least one variable resistance device by sensing a voltage of the second node. The read unit may include a first read switch connected between a third power supply voltage terminal and the first node, and configured to be switched on according to an inverted signal of the read enable signal; a bias unit connected between the second node and a third node, and configured to be switched on and to supply a read current to the second node according to a bias signal; and second read switch connected between the third node and the ground voltage terminal, and configured to be switched on according to the read enable signal.

The read unit may further include a sense amplifier configured to generate a determination based on the voltage of the second node and a plurality of reference voltages that are different from one another to read the multi-level data based on the determination. The bias unit may include a bias switch. A size of the bias switch may be configured such that the bias switch does not to influence the set resistance value of the at least one variable resistance device.

The write enable signal and the read enable signal may be synchronized with a clock signal.

The at least one variable resistance device may include at least one selected from the group consisting of a memristor and a resistive memory device.

According to an example embodiment, an integrated circuit includes a controller configured to produce a write enable signal and a read enable signal; and a write unit configured to receive the write enable signal; and a read unit configured to receive the read enable signal. The write unit includes at least one variable resistance device configured such that a resistance value of the at least one variable resistance device varies according to at least one selected value, the selected value being selected from among a voltage and current of an input signal, the at least one variable resistance device being configured to memorize the resistance value, the write unit being configured to write multi-level data to the at least one variable resistance device by setting the resistance value based on the write enable signal. The read unit may be configured to read the multi-level data corresponding to the set resistance value of the at least one variable resistance device, based on the read enable signal.

The controller may be configured to produce the write enable signal and the read enable signal in synchronization with a clock signal.

According to an example embodiment, there is provided a method of operating a logic circuit that includes at least one variable resistance device that memorizes a resistance value, the resistance value varying according to at least one selected value, the selected value being selected from among a voltage and a current of an input signal, the method including setting the resistance value of the at least one variable resistance device based on the at least one selected value to, if a write enable signal is activated; and reading multi-level data corresponding to the set resistance value of the at least one variable resistance device by sensing the resistance value, if a read enable signal is activated.

The setting of the resistance value to the at least one variable resistance device may include supplying a write current to the at least one variable resistance device. The write current may be determined based on the at least one selected value.

The reading of the multi-level data corresponding to the resistance value may include supplying a read current to the at least one variable resistance device, wherein the read current is selected such that the read current does not influence the set resistance value of the at least one variable resistance device.

BRIEF DESCRIPTION OF THE DRAWINGS

These and/or other aspects will become apparent and more readily appreciated from the following description of the embodiments, taken in conjunction with the accompanying drawings of which: The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
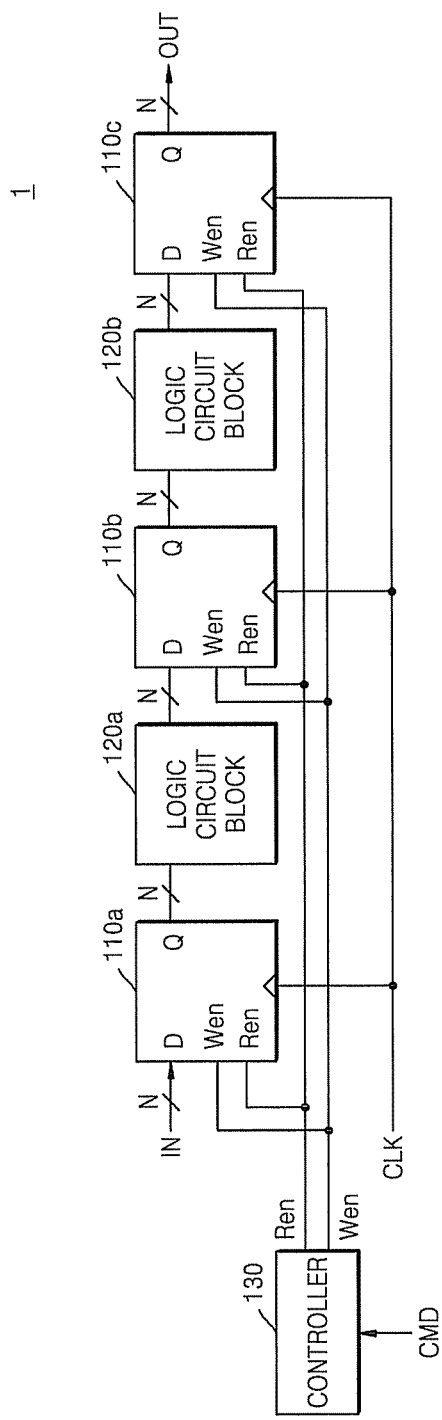
FIG. 1 is a schematic block diagram of an integrated circuit according to an example embodiment.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a schematic block diagram of an integrated circuit 1 according to an example embodiment. Referring to FIG. 1, the integrated circuit 1 may include a plurality of circuit blocks 110a, 110b, 110c, 120a, and 120b, and a controller 130. The integrated circuit 1 may be embodied as a single chip in one electronic system. An input signal IN supplied to the integrated circuit 1 may be a multi-bit signal, i.e., an N-bit signal, and each of the plurality of circuit blocks 110a, 110b, 110c, 120a, and 120b may thus include a multi-valued logic circuit. According to at least one example embodiment, the multi-valued logic circuit may be connected to one signal line instead of a plurality of signal lines so as to process N signals.

According to a related art, when the input signal IN is a 3-bit signal, each circuit block needs not only three latches but also an analog-to-digital converter that converts an input signal and a digital-to-analog converter that provides an output signal. Thus, the size of and power consumption in each circuit block is relatively great. However, according to the current embodiment, when the input signal IN is a 3-bit signal, each of the plurality of circuit blocks 110a, 110b, 110c, 120a, and 120b may include at least one variable resistance device (not shown in FIG. 1) so as to process a multi-bit signal, such as the 3-bit signal. Accordingly, a structure of each of the plurality of circuit blocks 110a, 110b, 110c, 120a, and 120b may be simplified, thus reducing the size and power consumption thereof.

The plurality of circuit blocks 110a, 110b, 110c, 120a, 120b may be categorized into first to third flip-flops 110a, 110b, and 110c and first and second logic circuit blocks 120a and 120b. The first to third flip-flops 110a, 110b, and 110c may correspond to sequential logic circuits, and the first and second logic circuit blocks 120a and 120b may correspond to combinational logic circuits. Although FIG. 1 illustrates the three flip-flops 110a, 110b, and 110c and the two logic circuit blocks 120a and 120b for convenience of explanation, according to at least one example embodiment, the integrated circuit 1 may include more than three flip-flops and more than two logic circuit blocks.

The first flip-flop 110a may receive the input signal IN from the outside, and latch the input signal IN to synchronize the input signal IN with a clock signal CLK. The first logic circuit block 120a may perform a predetermined or reference operation on an output signal of the first flip-flop 110a. The second flip-flop 110b may latch an output signal of the first logic circuit block 120a to synchronize the output signal with the clock signal CLK. The second logic circuit block 120b may perform a predetermined or reference operation on an output signal of the second flip-flop 110b. The third flip-flop 110c may latch an output signal of the second logic circuit block 120b to synchronize the output signal with the clock signal CLK.

Figure 2:
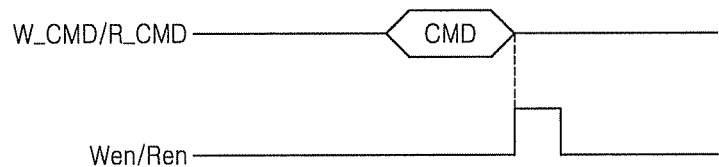
FIG. 2 is a timing diagram illustrating an operation of a controller included in the integrated circuit of FIG. 1, according to an example embodiment.

FIG. 2 is a timing diagram illustrating an operation of the controller 130 included in the integrated circuit 1 of FIG. 1, according to an example embodiment. Referring to FIGS. 1 and 2, the controller 130 may activate a write enable signal Wen or a read enable signal Ren, based on a command CMD received from the outside. In this case, the write enable signal Wen or the read enable signal Ren activated by the controller 130 may be supplied to the first to third flip-flops 110a, 110b, and 110c. Then, each of the first to third flip-flops 110a, 110b, and 110c may perform a read operation on the at least one variable resistance device therein according to the activated read enable signal Ren or may perform a write operation on the at least one variable resistance device therein according to the activated write enable signal Wen.

Referring back to FIG. 1, each of the first to third flip-flops 110a, 110b, 110c may include the at least one variable resistance device. Specifically, the at least one variable resistance device may have memorized therein a resistance value that varies according to at least one selected from the group consisting of a voltage and current of an input signal. According to an example embodiment, the at least one variable resistance device may be a memristor. According to an example embodiment, the at least one variable resistance device may be a resistive memory device, such as a resistance random access memory (RRAM) or a phase-change RAM (PRAM).

Each of the first to third flip-flops 110a, 110b, and 110c may perform the read or write operation on the at least one variable resistance device therein according to the write enable signal Wen or the read enable signal Ren. Thus, each of the first to third flip-flops 110a, 110b, and 110c may perform the read or write operation on the at least one variable resistance device therein when the write enable signal Wen or the read enable signal Ren is activated, and may perform a general latch operation when the write enable signal Wen or the read enable signal Ren is deactivated.

In the current embodiment, the at least one variable resistance device included in each of the first to third flip-flops 110a, 110b, and 110c may have a resistance value that varies according to at least one selected from the group consisting of a voltage and current of a signal input thereto. Thus, each of the first to third flip-flops 110a, 110b, and 110c may latch multi-bit data corresponding to the resistance value of the at least one variable resistance device therein.

Also, in the current embodiment, the at least one variable resistance device included in each of the first to third flip-flops 110a, 110b, and 110c may retain the resistance value even when a power cutoff occurs therein. Thus, the first to third flip-flops 110a, 110b, and 110c may act as non-volatile flip-flops. Non-volatile flip-flops as examples of a logic circuit according to an example embodiment will now be described in detail.

Figure 3:
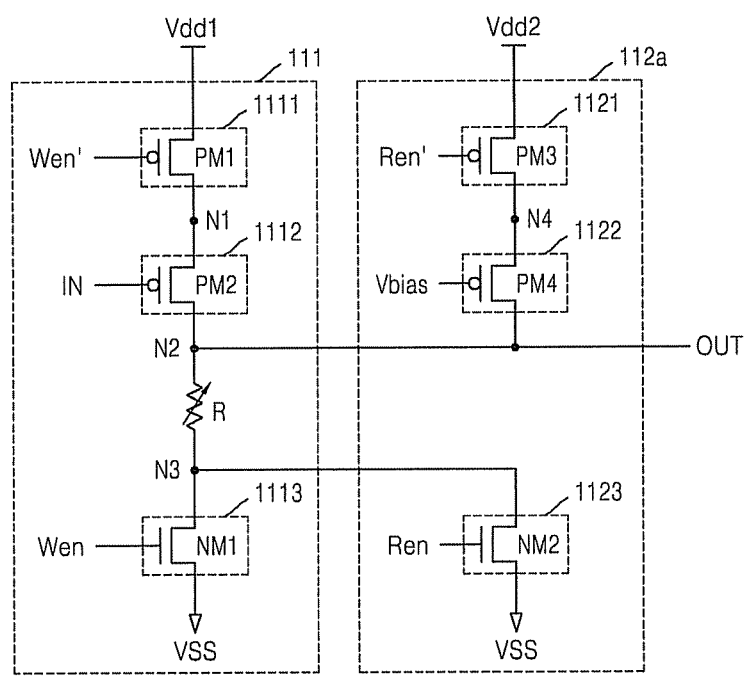
FIG. 3 is a circuit diagram of a flip-flop included in the integrated circuit of FIG. 1, according to an example embodiment.

FIG. 3 is a circuit diagram of the flip-flop 110a included in the integrated circuit 1 of FIG. 1, according to an example embodiment. Referring to FIG. 3, the first flip-flop 110a may include a write unit 111 and a read unit 112a. Although FIG. 3 specifically illustrates the structure of the first flip-flop 110a, the second and third flip-flops 110b and 110c may have, for example, the same structure as the first flip-flop 110a. Accordingly, the current embodiment may also be applied to the second and third flip-flops 110b and 110c.

The write unit 111 may include a first write switch 1111, a current supply unit 1112, at least one variable resistance device R, and a second write switch 1113. The elements of the write unit 111 will now be described in detail.

The first write switch 1111 may be connected between a first power supply voltage Vdd1 terminal and a first node N1, and may be switched on according to an inverted write enable signal Wen', that is, an inverted signal of the write enable signal Wen. For example, the first write switch 1111 may include a PMOS transistor PM1 having a source connected to the first power supply voltage Vdd1 terminal, a drain connected to the first node N1, and a gate to which the inverted write enable signal Wen' is supplied.

The current supply unit 1112 may be connected between the first node N1 and a second node N2, and may be switched on according to the input signal IN to provide a write current to the second node N2. For example, the current supply unit 1112 may include a current supply switch PM2 having a source connected to the first node N1, a drain connected to the second node N2, and a gate to which the input signal IN is supplied. The current supply switch PM2 may be embodied as a PMOS transistor. The size of the current supply switch PM2 is not limited and is variable, and thus, the write current supplied to the second node N2 is variable. For example, the size of the current supply switch PM2 may be four times that of the first write switch 1111 (e.g., four times the area).

The at least one variable resistance device R may be connected between the second node N2 and a third node N3. A current flowing through the at least one variable resistance device R may vary, e.g., increase, according to the write current supplied to the second node N2.

The second write switch 1113 may be connected between the third node N3 and a ground voltage Vss terminal and may be switched on according to the write enable signal Wen. For example, the second write switch 1113 may include an NMOS transistor NM1 having a drain connected to the third node N3, a source connected to the ground voltage Vss terminal, and a gate to which the write enable signal Wen is supplied.

When the write enable signal Wen is activated, the first and second write switches 1111 and 1113 may be turned on, and the current supply unit 1112 may supply the write current corresponding to a voltage of the input signal IN to the at least one variable resistance device R. In this case, a resistance value of the at least one variable resistance device R may vary according to the write current supplied to the at least one variable resistance device R. Thus, a desired resistance value may be written to the at least one variable resistance device R as described above.

The read unit 112a may include a first read switch 1121, a bias unit 1122, and a second read switch 1123. The elements of the read unit 112a will now be described in detail.

The first read switch 1121 may be connected between a second power supply voltage Vdd2 terminal and a fourth node N4, and may be switched on according to an inverted read enable signal Ren', that is, an inverted signal of the read enable signal Ren. For example, the first read switch 1121 may include a PMOS transistor PM3 having a source connected to the second power supply voltage Vdd2 terminal, a drain connected to the fourth node N4, and a gate to which the inverted read enable signal Ren' is supplied. According to an example embodiment, a voltage of the second power supply voltage Vdd2 terminal may be equal to that of the first power supply voltage Vdd1 terminal. According to an example embodiment, the voltage of the second power supply voltage Vdd2 terminal may be different from that of the first power supply voltage Vdd1 terminal.

The bias unit 1122 may be connected between the fourth node N4 and the second node N2 and may be switched on according to a bias signal Vbias to provide a read current to the second node N2. For example, the bias unit 1122 may include a bias switch PM4 having a source connected to the fourth node N4, a drain connected to the second node N2, and a gate to which the bias signal Vbias is supplied. The bias switch PM4 may be embodied as a PMOS transistor. In this case, the size of the bias switch PM4 may be determined to be small so as not to influence the resistance value written to the at least one variable resistance device R. For example, the size, or area, of the bias switch PM4 may be 0.3 times that of the first write switch 1111.

The second read switch 1123 may be connected between the third node N3 and the ground voltage Vss terminal and may be switched on according to the read enable signal Ren. For example, the second read switch 1123 may include an NMOS transistor NM2 having a drain connected to the third node N3, a source connected to the ground voltage Vss terminal, and a gate to which the read enable signal Ren is supplied.

When the read enable signal Ren is activated, the first and second read switches 1121 and 1123 may be turned on and the bias unit 1122 may supply the read current to the at least one variable resistance device R. When the read enable signal Ren is activated, the read unit 112a may read multi-level data corresponding to the resistance value written to the at least one variable resistance device R by sensing a voltage of the second node N2.

According to the current embodiment, if the write enable signal Wen is activated, an increase in the voltage of the input signal IN results in an increase in the current flowing through the at least one variable resistance device R, thereby increasing the voltage of the second node N2. Thus, a voltage of an output signal OUT of the first flip-flop 110a may be proportional to the voltage of the input signal IN.

Figure 4:
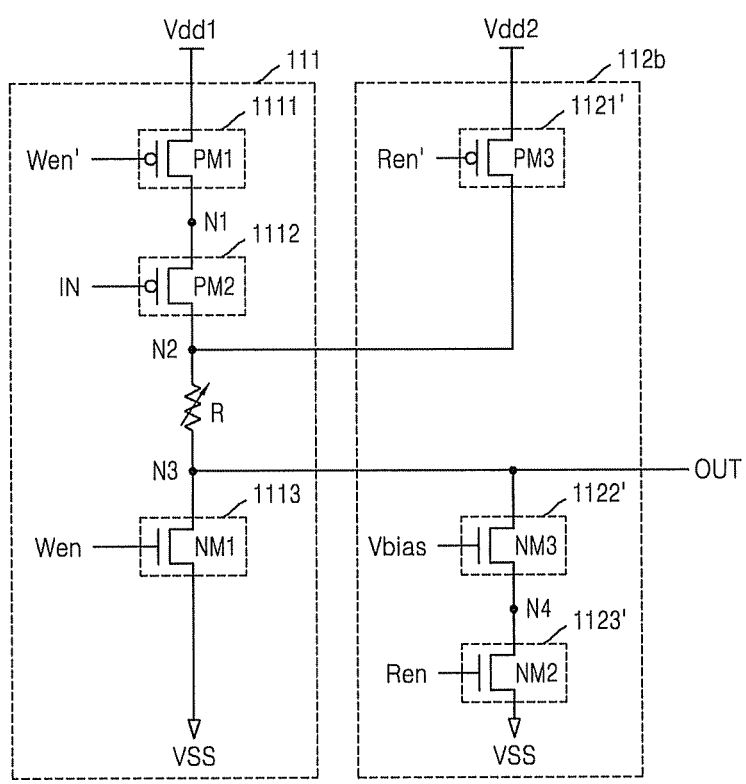
FIG. 4 is a circuit diagram of a flip-flop included in the integrated circuit of FIG. 1, according to an example embodiment.

FIG. 4 is a circuit diagram of a flip-flop 110a' included in the integrated circuit 1 of FIG. 1, according to an example embodiment. Referring to FIG. 4, the first flip-flop 110a' may include a write unit 111 and a read unit 112b. The first flip-flop 110a' is a modified example of the first flip-flop 110a illustrated in FIG. 3. In detail, the first flip-flop 110a is different from the first flip-flop 110a of FIG. 3 with respect to a structure of the read unit 112b but may be, for example, the same as the first flip-flop 110a of FIG. 3 with respect to the write unit 111. Thus, the first flip-flop 110a' according to the current embodiment will be described in detail focusing on the structure of the read unit 112b.

The read unit 112b may include a first read switch 1121', a bias unit 1122', and a second read switch 1123'. The elements of the read unit 112b will now be described.

The first read switch 1121' may be connected between a second power supply voltage Vdd2 terminal and the second node N2 and may be switched on according to an inverted read enable signal Ren', that is, an inverted signal of the read enable signal Ren. For example, the first read switch 1121' may include a PMOS transistor PM3 having a source connected to the second power supply voltage Vdd2 terminal, a drain connected to the second node N2, and a gate to which the inverted read enable signal Ren' is supplied. According to an example embodiment, a voltage of the second power supply voltage Vdd2 terminal may be equal to that of the first power supply voltage Vdd1 terminal. According to an example embodiment, the voltage of the second power supply voltage Vdd2 terminal may be different from that of the first power supply voltage Vdd1 terminal.

The bias unit 1122' may be connected between the third node N3 and a fourth node N4 and may be switched on according to a bias signal Vbias to supply a read current to the third node N3. For example, the bias unit 1122' may include a bias switch NM3 having a drain connected to the third node N3, a source connected to the fourth node N4, and a gate to which the bias signal Vbias is supplied. The bias switch NM3 may be embodied as an NMOS transistor. In this case, the size, or area, of the bias switch NM3 may be determined to be small not to influence the resistance value written to the at least one variable resistance device R. For example, the size, or area, of the bias switch NM3 may be 0.3 times that of the first write switch 1111, e.g., a PMOS transistor PM1.

The second read switch 1123' may be connected between the fourth node N4 and the ground voltage Vss terminal and may be switched on according to the read enable signal Ren. For example, the second read switch 1123' may include an NMOS transistor NM2 having a drain connected to the fourth node N4, a source connected to the ground voltage Vss terminal, and a gate to which the read enable signal Ren is supplied.

When the read enable signal Ren is activated, the first and second read switches 1121' and 1123' may be turned on and the bias unit 1122' may provide the read current to the at least one variable resistance device R. When the read enable signal Ren is activated, the read unit 112b may read multi-level data corresponding to the resistance value written to the at least one variable resistance device R by sensing a voltage of the third node N3.

According to the current embodiment, when the write enable signal Wen is activated, an increase in a voltage of the input signal IN results in an increase in the current flowing through the at least one variable resistance device R, thereby reducing the voltage of the third node N3. Thus, a voltage of an output signal OUT of the first flip-flop 110a' may be inversely proportional to the voltage of the input signal IN.

Figure 5:
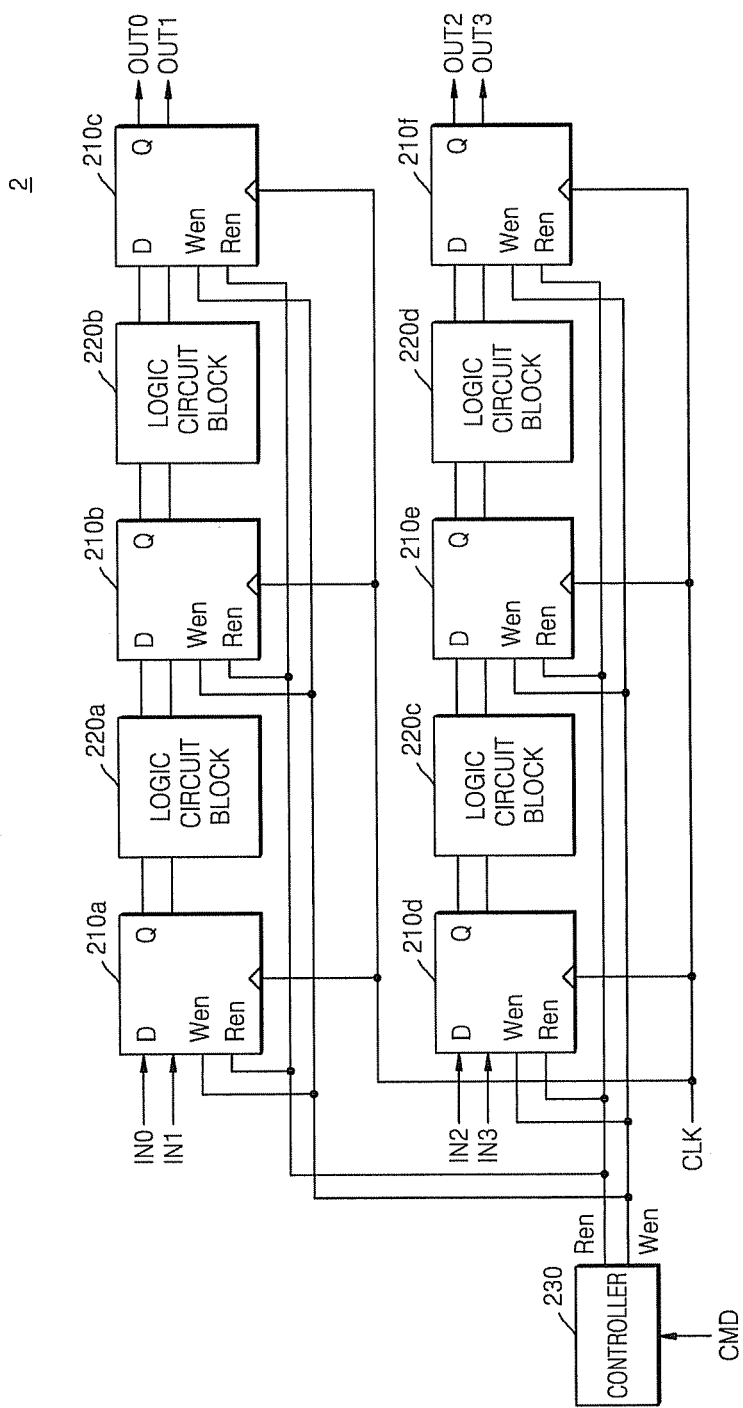
FIG. 5 is a schematic block diagram of an integrated circuit according to an example embodiment.

FIG. 5 is a schematic block diagram of an integrated circuit 2 according to an example embodiment. Referring to FIG. 5, the integrated circuit 2 may include a plurality of circuit blocks 210a to 210f and 220a to 220d, and a controller 230. The integrated circuit 2 may be embodied as a single chip in one electronic system. An input signal IN supplied to the integrated circuit 2 may be a multi-bit signal, i.e., an N-bit signal. In the current embodiment, the input signal IN may be a 4-bit signal.

According to a related art, when the input signal IN is a 4-bit signal, at least four binary circuit blocks are needed to process bit signals included in the 4-bit signal, respectively. However, according to the current embodiment, when the input signal IN is a 4-bit signal, only two binary circuit blocks are needed to process bit signals included in the 4-bit signal since each of the two binary circuit blocks may process 2-bit signals. According to an example embodiment, at least one circuit block may be used to process the 4-bit signal.

The plurality of circuit blocks 210a to 210f and 220a to 220d may be classified into first to sixth flip-flops 210a to 210f and first to fourth logic circuit blocks 220a to 220d. The first to sixth flip-flops 210a to 210f may correspond to sequential logic circuits, and the first to fourth logic circuit blocks 220a to 220d may correspond to combinational logic circuits. Although FIG. 5 illustrates the six flip-flops 210a to 210f and the four logic circuit blocks 220a to 220d for convenience of explanation, according to at least one example embodiment, the integrated circuit 2 may include more than six flip-flops and more than four logic circuit blocks.

The first flip-flop 210a may receive input signals IN0 and IN1 from the outside, and latch the input signals IN0 and IN1 to synchronize the input signals IN0 and IN1 with a clock signal CLK. The first logic circuit block 220a may perform a predetermined or reference logic operation on output signals of the first flip-flop 210a. The second flip-flop 210b may latch the output signals of the first logic circuit block 220a to synchronize the output signals with the clock signal CLK. The second logic circuit block 220b may perform a predetermined or reference logic operation on output signals of the second flip-flop 210b. The third flip-flop 210c may provide output signals OUT0 and OUT1 by latching output signals of the second logic circuit block 220b to synchronize the output signals with the clock signal CLK.

The fourth flip-flop 210d may receive input signals IN2 and IN3 from the outside and latch the input signals IN2 and IN3 to synchronize the input signals IN2 and IN3 with the clock signal CLK. The third logic circuit block 220c may perform a predetermined or reference logic operation on output signals of the fourth flip-flop 210d. The fifth flip-flop 210e may latch output signals of the third logic circuit block 220c to synchronize the output signals with the clock signal CLK. The fourth logic circuit block 220d may perform a predetermined or reference logic operation on output signals of the fifth flip-flop 210e. The sixth flip-flop 210f may provide output signals OUT2 and OUT3 by latching output signals of the fourth logic circuit block 220d to synchronize the output signals with the clock signal CLK.

The controller 230 may activate a write enable signal Wen or a read enable signal Ren based on a command CMD received from the outside. The write enable signal Wen or the read enable signal Ren activated by the controller 230 may be transmitted to the first to sixth flip-flops 210a to 210f. Then, each of the first to sixth flip-flops 210a to 210f may perform a read operation on at least one variable resistance device therein according to the activated read enable signal Ren or may perform a write operation on the at least one variable resistance device therein according to the activated enable signal Wen.

Each of the first to sixth flip-flops 210a to 210f may include at least one variable resistance device. The at least one variable resistance device may have memorized therein a resistance value that varies according to at least one selected from the group consisting of a voltage and current of a signal input thereto. According to an example embodiment, the at least one variable resistance device may be a memristor. According to an example embodiment, the at least one variable resistance device may be a resistive memory device, such as an RRAM or a PRAM.

Each of the first to sixth flip-flops 210a to 210f may perform the read or write operation on the variable resistance device therein according to the write enable signal Wen or the read enable signal Ren. That is, each of the first to sixth flip-flops 210a to 210f may perform the read or write operation on the variable resistance device therein when the write enable signal Wen or the read enable signal Ren is activated and may perform a general latch operation when the write enable signal Wen or the read enable signal Ren is deactivated.

In the current embodiment, the at least one variable resistance device included in each of the first to sixth flip-flops 210a to 210f may have a resistance value that varies according to at least one selected from the group consisting of a voltage and current of a signal input thereto. Thus, each of the first to sixth flip-flops 210a to 210f may latch multi-bit data corresponding to the resistance value of the at least one variable resistance device therein.

Also, in the current embodiment, the at least one variable resistance device included in each of the first to sixth flip-flops 210a to 210f may retain the resistance value even when a power cutoff occurs. Thus, the first to sixth flip-flops 210a to 210f may act as non-volatile flip-flops. Non-volatile flip-flops as examples of a logic circuit according to an example embodiment will now be described in detail.

Figure 6:
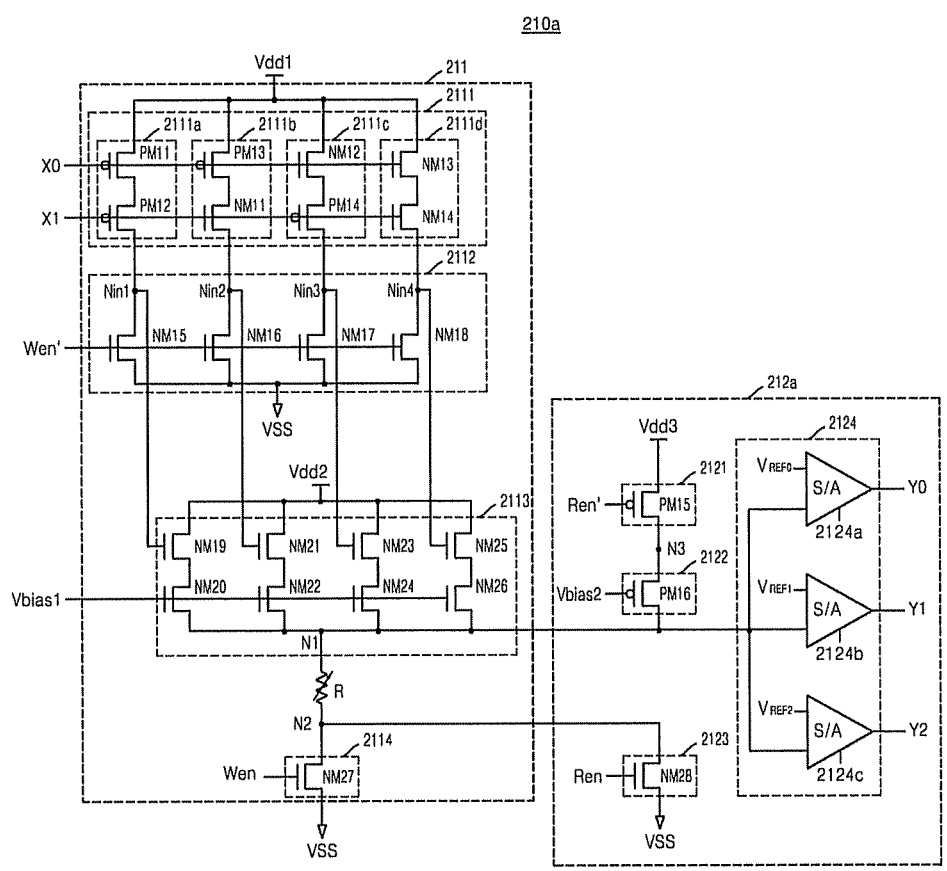
FIG. 6 is a circuit diagram specifically illustrating a flip-flop included in the integrated circuit of FIG. 5, according to an example embodiment.

FIG. 6 is a circuit diagram specifically illustrating the flip-flop 210a included in the integrated circuit 2 of FIG. 5, according to an example embodiment. Referring to FIG. 6, the first flip-flop 210a may include a write unit 211 and a read unit 212a. Although FIG. 6 specifically illustrates a structure of the first flip-flop 210a, the second to sixth flip-flops 210b to 210f may have, for example, the same structure as the first flip-flop 210a. Accordingly, the current embodiment may also be applied to the second to sixth flip-flops 210b to 210f.

The write unit 211 may include an input signal receiving unit 2111, a first write switching unit 2112, a current supply unit 2113, at least one variable resistance device R, and a second write switch 2114. The elements of the write unit 211 will now be described.

The input signal receiving unit 2111 may be connected between a first power supply voltage Vdd1 terminal and first to fourth input nodes Nin1, Nin2, Nin3, and Nin4, and may activate one of the first to fourth input nodes Nin1, Nin2, Nin3, and Nin4 according to first and second input signals X0 and X1. In detail, if the total number of input signals supplied to the input signal receiving unit 2111 is N, then the total number of input nodes may be $2^N$ and the input signal receiving unit 2111 may include $2^N$ input node activation units, e.g., four input node activation units 2111a to 2111d when N is '2'.

In the current embodiment, the input signal receiving unit 2111 may receive the two input signals X0 and X1, and the first and second input signals X0 and X1 may correspond to the input signals IN0 and IN1 of FIG. 5, respectively. Thus, the input signal receiving unit 2111 may include first to fourth input node activation units 2111a to 2111d.

The first input node activation unit 2111a may include first and second PMOS transistors PM11 and PM12 that are connected in series between the first power supply voltage Vdd1 terminal and the first input node Nin1. The first PMOS transistor PM11 may have a source connected to the first power supply voltage Vdd1 terminal and a gate to which the first input signal X0 is supplied. The second PMOS transistor PM12 may have a source connected to a drain of the first PMOS transistor PM11, a drain connected to the first input node Nin1, and a gate to which the second input signal X1 is supplied. If the first and second input signals X0 and X1 are logic 'low', the first and second PMOS transistors PM11 and PM12 may be turned on. Then, the first input node activation unit 2111a may activate the first input node Nin1 to apply a first power supply voltage Vdd1 to the first input node Nin1.

The second input node activation unit 2111b may include a third PMOS transistor PM13 and a first NMOS transistor NM11 that are connected in series between the first power supply voltage Vdd1 terminal and the second input node Nin2. The third PMOS transistor PM13 may have a source connected to the first power supply voltage Vdd1 terminal and a gate to which the first input signal X0 is applied. The first NMOS transistor NM11 may have a drain connected to a drain of the third PMOS transistor PM13, a source connected to the second input node Nin2, and a gate to which the second input signal X1 is supplied. If the first input signal X0 is logic 'low' and the second input signal X1 is logic 'high, then the third PMOS transistor PM13 and the first NMOS transistor NM11 may be turned on. Thus, the second input node activation unit 2111b may activate the second input node Nin2 to apply the first power supply voltage Vdd1 to the second input node Nin2.

The third input node activation unit 2111c may have a second NMOS transistor NM12 and a fourth PMOS transistor PM14 that are connected in series between the first power supply voltage Vdd1 terminal and the third input node Nin3. The second NMOS transistor NM12 may have a drain connected to the first power supply voltage Vdd1 terminal and a gate to which the first input signal X0 is supplied. The fourth PMOS transistor PM14 may have a source connected to a source of the second NMOS transistor NM12, a drain connected to the third input node Nin3, and a gate to which the second input signal X1 is supplied. If the first input signal X0 is logic 'high' and the second input signal X1 is logic 'low, the second NMOS transistor NM12 and the fourth PMOS transistor PM14 may be turned on. Thus, the third input node activation unit 2111c may activate the third input node Nin3 to apply the first power supply voltage Vdd1 to the third input node Nin3.

The fourth input node activation unit 2111d may have third and fourth NMOS transistors NM13 and NM14 that are connected in series between the first power supply voltage Vdd1 terminal and the fourth input node Nin4. The third NMOS transistor NM13 may have a drain connected to the first power supply voltage Vdd1 terminal and a gate to which the first input signal X0 is supplied. The fourth NMOS transistor NM14 may have a drain connected to a source of the third NMOS transistor NM13, a source connected to the fourth input node Nin4, and a gate to which the second input signal X1 is supplied. If the first and second input signals X0 and X1 are logic 'high', the third and fourth NMOS transistors NM13 and NM14 may be turned on. Thus, the fourth input node activation unit 2111d may activate the fourth input node Nin4 to apply the first power supply voltage Vdd1 to the fourth input node Nin4.

The first write switching unit 2112 may be connected between the first to fourth input nodes Nin1, Nin2, Nin3, and Nin4 and a ground voltage Vss terminal, and may be switched on according to an inverted write enable signal Wen', that is, an inverted signal of the write enable signal Wen. In the current embodiment, since the total number of input signals is '2' and the total number of input nodes is '4', the first write switching unit 2112 may include four switches, e.g., fifth to eighth NMOS transistors NM15, NM16, NM17, and NM18.

The fifth to eighth NMOS transistors NM15, NM16, NM17, and NM18 may have drains connected to the first to fourth input nodes Nin1, Nin2, Nin3, and Nin4, respectively, sources commonly connected to the ground voltage Vss terminal, and gates to which the inverted write enable signal Wen' is commonly supplied. Thus, when the write enable signal Wen is activated, the inverted write enable signal Wen' is deactivated and the fifth to eighth NMOS transistors NM15, NM16, NM17, and NM18 are turned off.

The current supply unit 2113 may be connected between a second power supply voltage Vdd2 terminal and a first node N1, and may supply a write current to the first node N1 based on an activated input node from among the first to fourth input nodes Nin1, Nin2, Nin3, and Nin4. According to an example embodiment, a voltage of the second power supply voltage Vdd2 terminal may be equal to that of the first power supply voltage Vdd1 terminal. According to an example embodiment, the voltage of the second power supply voltage Vdd2 terminal may be different from that of the first power supply voltage Vdd1 terminal.

In the current embodiment, the current supply unit 2113 may include first to fourth switches NM19, NM21, NM23, and NM25 and first to fourth current adjustment devices NM20, NM22, NM24, and NM26. The first to fourth switches NM19, NM21, NM23, and NM25 and the first to fourth current adjustment devices NM20, NM22, NM24, and NM26 may be embodied as NMOS transistors, but according to at least one example embodiment, they may be embodied as PMOS transistors.

The first to fourth switches NM19, NM21, NM23, and NM25 may have drains commonly connected to the second power supply voltage Vdd2 terminal, and gates connected to the first to fourth input nodes Nin1, Nin2, Nin3, and Nin4, respectively. Thus, a switch from among the first to fourth switches NM19, NM21, NM23, and NM25 that is connected to an activated node from among the first to fourth input nodes Nin1, Nin2, Nin3, and Nin4 may be turned on and the other switches may be turned off. For example, if the first and second input signals X0 and X1 are logic 'low', the first input node Nin1 may be activated. In this case, only the first switch NM19 connected to the first input node Nin1 may be turned on and the other second to fourth switches NM21, NM23, and NM25 may be turned off.

The first to fourth current adjustment devices NM20, NM22, NM24, and NM26 may have drains connected to sources of the first to fourth switches NM19, NM21, NM23, and NM25, respectively, sources commonly connected to the first node N1, and gates to which a first bias signal Vbias1 is commonly supplied.

The sizes, or areas, of the first to fourth current adjustment devices NM20, NM22, NM24, and NM26 are not limited and are variable, and thus the write current supplied to the first node N1 is variable. For example, the size, or area, of the first current adjustment device NM20 may be four times that of the fourth current adjustment device NM26, the size, or area, of the second current adjustment device NM22 may be three times that of the fourth current adjustment device NM26, and the size, or area, of the third current adjustment device NM24 may two times that of the fourth current adjustment device NM26.

If the first switch NM19 is turned on, the first current adjustment device NM20 may supply the write current to the first node N1. If the second switch NM21 is turned on, the second current adjustment device NM22 may supply the write current to the first node N1. If the third switch NM23 is turned on, the third current adjustment device NM24 may supply the write current to the first node N1. If the fourth switch NM25 is turned on, the fourth current adjustment device NM26 may supply the write current to the first node N1.

The at least one variable resistance device R may be connected between the first node N1 and a second node N2. A current flowing through the at least one variable resistance device R may vary, e.g., increase, according to the write current supplied to the first node N1.

The second write switch 2114 may be connected between the second node N2 and the ground voltage Vss terminal and may be switched on according to the write enable signal Wen. For example, the second write switch 2114 may include an NMOS transistor NM27 having a drain connected to the second node N2, a source connected to the ground voltage Vss terminal, and a gate to which the write enable signal Wen is supplied.

If the write enable signal Wen is activated, then the fifth to eighth NMOS transistors NM15, NM16, NM17, and NM18 included in the first write switching unit 2112 are turned off, the NMOS transistor NM27 included in the second write switch 2114 is turned on, and the current supply unit 2113 may supply the write current to the at least one variable resistance device R according to voltages of the first and second input signals X0 and X1. In this case, a resistance value of the at least one variable resistance device R may vary according to the write current flowing through the at least one variable resistance device R, thereby writing a predetermined or reference resistance value to the at least one variable resistance device R.

The read unit 212a may include a first read switch 2121, a bias unit 2122, a second read switch 2123, and a sense amplifier unit 2124. The elements of the read unit 212a will now be described in detail.

The first read switch 2121 may be connected between a third power supply voltage Vdd3 terminal and a third node N3 and may be switched on according to an inverted read enable signal Ren', that is, an inverted signal of the read enable signal Ren. For example, the first read switch 2121 may include a PMOS transistor PM15 having a source connected to the third power supply voltage Vdd3 terminal, a drain connected to the third node N3, and a gate to which an inverted read enable signal Ren' is supplied. According to an example embodiment, a voltage of the third power supply voltage Vdd3 terminal may be equal to the voltage of the first power supply voltage Vdd1 terminal or the voltage of the second power supply voltage Vdd2 terminal. According to an example embodiment, the voltage of the third power supply voltage Vdd3 terminal may be different from the voltage of the first power supply voltage Vdd1 terminal or the voltage of the second power supply voltage Vdd2 terminal.

The bias unit 2122 may be connected between the third node N3 and the first node N1 and may be switched on according to a second bias signal Vbias2 to supply a read current to the first node N1. For example, the bias unit 2122 may include a bias switch PM16 having a source connected to the third node N3, a drain connected to the first node N1, and a gate to which the second bias signal Vbias2 is supplied. The bias switch PM16 may be embodied as a PMOS transistor. In this case, the size, or area, of the bias switch PM16 may be determined to be small not to influence the resistance value written to the at least one variable resistance device R. For example, the size, or area, of the bias switch PM16 may be 0.3 times that of the fourth current adjustment device NM26.

The second read switch 2123 may be connected between the second node N2 and the ground voltage Vss terminal, and may be switched on according to the read enable signal Ren. For example, the second read switch 2123 may include an NMOS transistor NM28 having a drain connected to the second node N2, a source connected to the ground voltage Vss terminal, and a gate to which the read enable signal Ren is supplied.

When the read enable signal Ren is activated, the first and second read switches 2121 and 2123 may be turned on and the bias unit 2122 may supply the read current to the at least one variable resistance device R. As described above, the read unit 212 may read multi-level data corresponding to the resistance value written to the at least one variable resistance device R by sensing a voltage of the first node N1.

Furthermore, the read unit 212a may further include the sense amplifier unit 2124. The sense amplifier unit 2124 may include first to third sense amplifiers 2124a, 2124b, and 2124c. The first sense amplifier 2124a may compare the voltage of the first node N1 with a first reference voltage $V_{REF0}$, the second sense amplifier 2124b may compare the voltage of the first node N1 with a second reference voltage $V_{REF1}$, and the third sense amplifier 2124c may compare the voltage of the first node N1 with a third reference voltage $V_{REF3}$.

Figure 7:
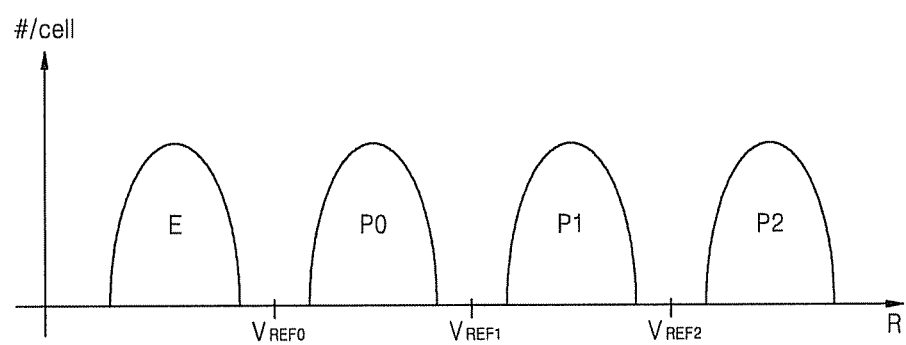
FIG. 7 is a graph illustrating reference voltages used in a sense amplifier unit included in the flip-flop of FIG. 6, according to an example embodiment.

FIG. 7 is a graph illustrating the reference voltages used in the sense amplifier unit 2124 included in the flip-flop 210a of FIG. 6, according to an example embodiment. In FIG. 7, an X-axis denotes a resistance value and a Y-axis denotes the total number of cells. If an input signal is a 2-bit signal, the at least one variable resistance device R of FIG. 6 may have four states corresponding to four different resistance values. In detail, the at least one variable resistance device R may have an erase state E when the input signal is '11', may have a first program state P0 when the input signal is '01', may have a second program state P1 when the input signal is '10', and may have a third program state P2 when the input signal is '00'.

In FIG. 7, the first reference voltage $V_{REF0}$ may correspond to a resistance value between the erase state E and the first program state P0. The second reference voltage $V_{REF1}$ may correspond to a resistance value between the first program state P0 and the second program state P1. The third reference voltage $V_{REF2}$ may correspond to a resistance value between the second program state P1 and the third program state P2.

Referring back to FIG. 6, the first flip-flop 210a may further include a logic circuit block (not shown) that produces a 2-bit output signal based on output signals Y0, Y1, and Y2 of the read unit 212a.

Figure 8:
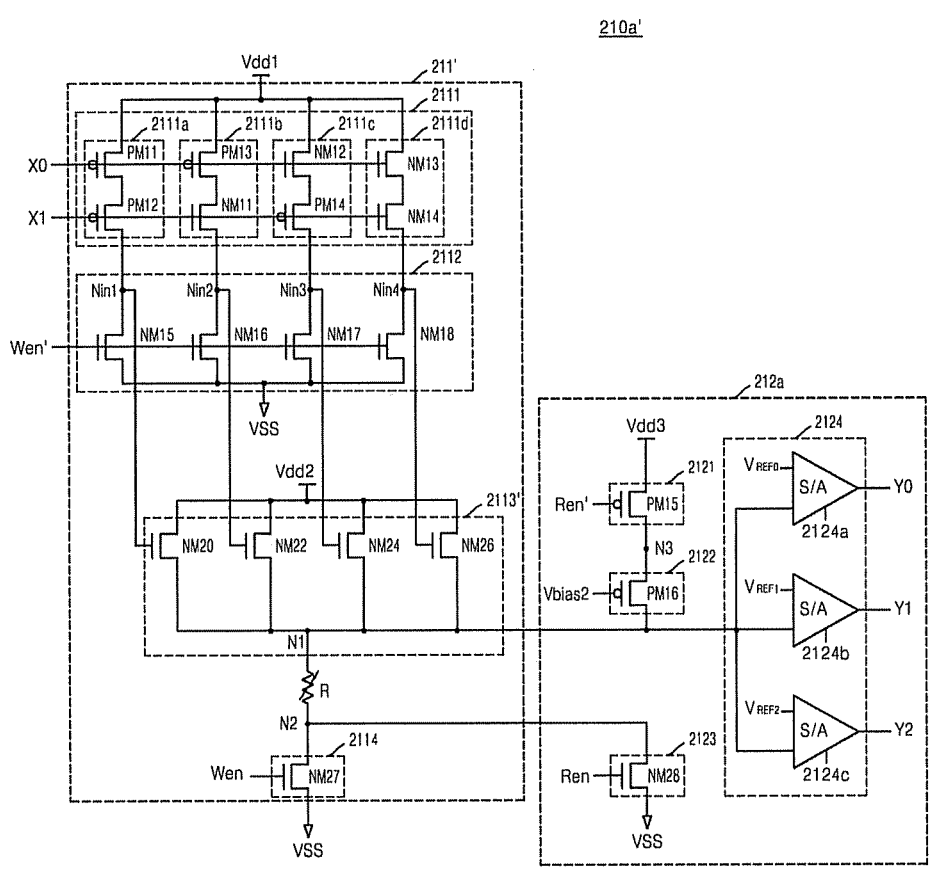
FIG. 8 is a circuit diagram specifically illustrating a flip-flop included in the integrated circuit of FIG. 5, according to an example embodiment.

FIG. 8 is a circuit diagram specifically illustrating a flip-flop 210a' included in the integrated circuit 2 of FIG. 5, according to an example embodiment. Referring to FIG. 8, the first flip-flop 210a' may include a write unit 211' and a read unit 212a. The first flip-flop 210a' is a modified example of the first flip-flop 210a illustrated in FIG. 6. In detail, the first flip-flop 210a' is different from the first flip-flop 210a of FIG. 6 with respect to a structure of the write unit 211' but may be, for example, the same as the first flip-flop 210a of FIG. 6 with respect to the read unit 212a. Thus, the first flip-flop 210a' according to the current embodiment will be described in detail focusing on the structure of the write unit 211'.

The write unit 211' may include an input signal receiving unit 2111, a first write switching unit 2112, a current supply unit 2113', at least one variable resistance device R, and a second write switch 2114. The input signal receiving unit 2111, the first write switching unit 2112, the at least one variable resistance device R, and the second write switch 2114 of FIG. 8 may be the same as the input signal receiving unit 2111, the first write switching unit 2112, the at least one variable resistance device R, and the second write switch 2114 included in the first flip-flop 210a of FIG. 6, respectively. The current supply unit 2113' of FIG. 8 will now be described in detail.

The current supply unit 2113' may be connected between a second power supply voltage Vdd2 terminal and the first node N1 and may supply a write current corresponding to a voltage of an activated input node from among the first to fourth input nodes Nin1, Nin2, Nin3, and Nin4 to the first node N1. According to an example embodiment, a voltage of the second power supply voltage Vdd2 terminal may be equal to the voltage of the first power supply voltage Vdd1 terminal. According to an example embodiment, the voltage of the second power supply voltage Vdd2 terminal may be different from the voltage of the first power supply voltage Vdd1 terminal.

In the current embodiment, the current supply unit 2113' may include first to fourth current adjustment devices NM20, NM22, NM24, and NM26. The first to fourth current adjustment devices NM20, NM22, NM24, and NM26 may be embodied as NMOS transistors, but according to at least one example embodiment, they may be embodied as PMOS transistors.

The first to fourth current adjustment devices NM20, NM22, NM24, and NM26 may have drains being commonly connected to the second power supply voltage Vdd2 terminal, sources commonly connected to the first node N1, and gates connected to the first to fourth input nodes Nin1, Nin2, Nin3, and Nin4, respectively.

The sizes, or areas, of the first to fourth current adjustment devices NM20, NM22, NM24, and NM26 are not limited and are variable, and thus the write current supplied to the first node N1 is variable. For example, the size, or area, of the first current adjustment device NM20 may be four times the size, or area, of the fourth current adjustment device NM26, the size, or area, of the second current adjustment device NM22 may be three times the size, or area, of the fourth current adjustment device NM26, and the size, or area, of the third current adjustment device NM24 may be two times the size, or area, of the fourth current adjustment device NM26.

When the first input node Nin1 is activated, the first current adjustment device NM20 may be turned on to supply the write current to the first node N1. When the second input node Nin2 is activated, the second current adjustment device NM22 may be turned on to supply the write current to the first node N1. When the third input node Nin3 is activated, the third current adjustment device NM24 may be turned on to supply the write current to the first node N1. When the fourth input node Nin4 is activated, the fourth current adjustment device NM26 may be turned on to supply the write current to the first node N1.

According to the current embodiment, no switch may be installed between the second power supply voltage Vdd2 terminal and the first to fourth current adjustment devices NM20, NM22, NM24, and NM26. In this case, the first to fourth current adjustment devices NM20, NM22, NM24, and NM26 may be used as switches by connecting the gates of the first to fourth current adjustment devices NM20, NM22, NM24, and NM26 to the first to fourth input nodes Nin1, Nin2, Nin3, and Nin4, respectively. Also, the first to fourth current adjustment devices NM20, NM22, NM24, and NM26 may be used to adjust a current by setting the sizes, or areas, thereof to be different from one another.

Figure 9:
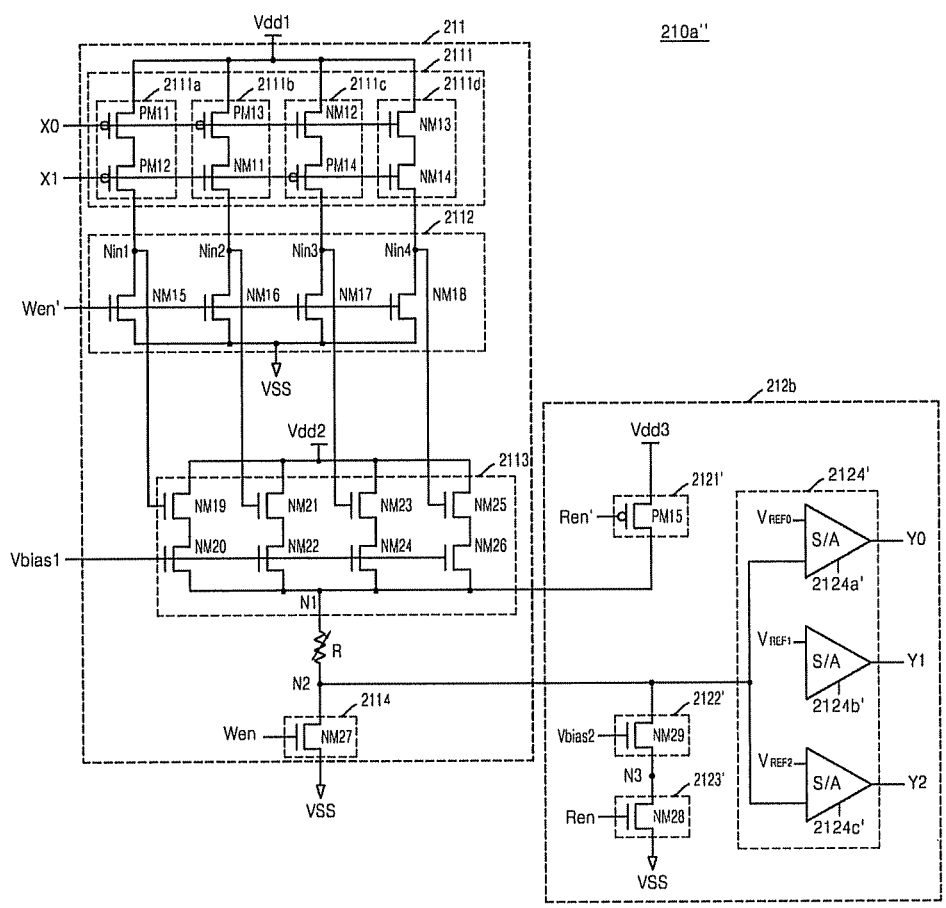
FIG. 9 is a circuit diagram specifically illustrating a flip-flop included in the integrated circuit of FIG. 5, according to an example embodiment.

FIG. 9 is a circuit diagram specifically illustrating a flip-flop 210a" included in the integrated circuit 2 of FIG. 5, according to an example embodiment. Referring to FIG. 9, the first flip-flop 210a" may include a write unit 211 and a read unit 212b. The first flip-flop 210a'' is a modified example of the first flip-flop 210a of FIG. 6. In detail, the first flip-flop 210a'' is different from the first flip-flop 210a of FIG. 6 with respect to a structure of the read unit 212b but may be, for example, the same as the first flip-flop 210a of FIG. 6 with respect to the structure of the write unit 211. Thus, the structure of the read unit 212b of FIG. 9 will now be described in detail.

The read unit 212b may include a first read switch 2121', a bias unit 2122', a second read switch 2123', and a sense amplifier unit 2124'. The elements of the read unit 212b will now be described.

The first read switch 2121' may be connected between a third power supply voltage Vdd3 terminal and the first node N1 and may be switched on according to an inverted read enable signal Ren', that is, an inverted signal of the read enable signal Ren. For example, the first read switch 2121' may include a PMOS transistor PM15 having a source connected to the third power supply voltage Vdd3 terminal, a drain connected to the first node N1, and a gate to which the inverted read enable signal Ren' is supplied. According to an example embodiment, a voltage of the third power supply voltage Vdd3 terminal may be equal to the voltage of the first power supply voltage Vdd1 terminal or the voltage of the second power supply voltage Vdd2 terminal. According to an example embodiment, the voltage of the third power supply voltage Vdd3 terminal may be different from the voltage of the first power supply voltage Vdd1 terminal or the voltage of the second power supply voltage Vdd2 terminal.

The bias unit 2122' may be connected between the second node N2 and a third node N3 and may be switched on according to a second bias signal Vbias2 to supply a read current to the second node N2. For example, the bias unit 2122' may include a bias switch NM29 having a drain connected to the second node N2, a source connected to the third node N3, and a gate to which the second bias signal Vbias2 is supplied. The bias switch NM29 may be embodied as an NMOS transistor. In this case, the size, or area, of the bias switch NM29 may be determined to be small not to influence a resistance value written to at least one variable resistance device R. For example, the size, or area, of the bias switch NM29 may be 0.3 times that of the fourth current adjustment device NM26.

The second read switch 2123' may be connected between the third node N3 and the ground voltage Vss terminal and may be switched on according to the read enable signal Ren. For example, the second read switch 2123' may include an NMOS transistor NM28 having a drain connected to the third node N3, a source connected to the ground voltage Vss terminal, and a gate to which the read enable signal Ren is supplied.

When the read enable signal Ren is activated, the first and second read switches 2121' and 2123' may be turned on and the bias unit 2122' may supply the read current to the at least one variable resistance device R. As described above, when the read enable signal Ren is activated, the read unit 212b may read multi-level data corresponding to the resistance value written to the at least one variable resistance device R by sensing a voltage of the second node N2.

The read unit 212b may further include a sense amplifier unit 2124. The sense amplifier unit 2124 may include first to third sense amplifiers 2124a', 2124b', and 2124c'. The first sense amplifier unit 2124a' may compare the voltage of the second node N2 with a first reference voltage $V_{REF0}$. The second sense amplifier unit 2124b' may compare the voltage of the second node N2 with a second reference voltage $V_{REF1}$. The third sense amplifier unit 2124c' may compare the voltage of the second node N2 with a third reference voltage $V_{REF3}$.

Figure 10:
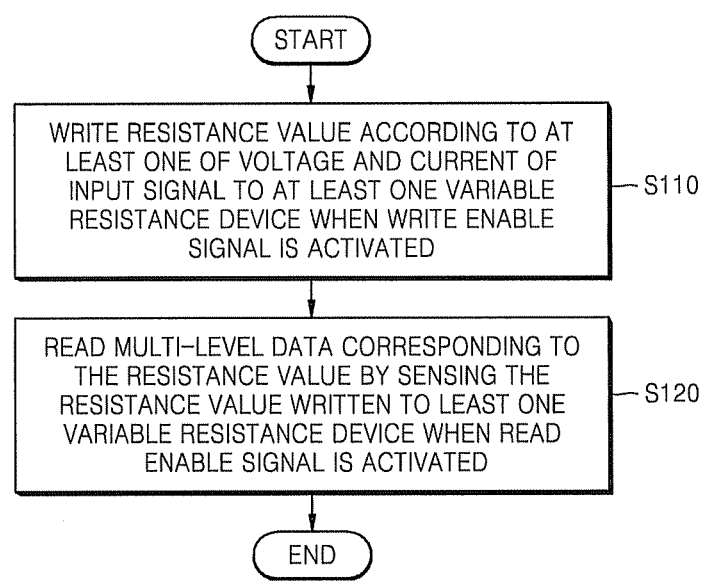
FIG. 10 is a flowchart illustrating a method of operating a logic circuit, according to an example embodiment.

FIG. 10 is a flowchart illustrating a method of operating a logic circuit, according to an example embodiment. The method of FIG. 10 is a method of operating a logic circuit and an integrated circuit as illustrated in FIGS. 1 to 9. Thus, the embodiments described above with reference to FIGS. 1 to 9 may be applied to the method of FIG. 10.

In operation S110, when a write enable signal is activated, a resistance value according to at least one selected from the group consisting of a voltage and current of an input signal is written to at least one variable resistance device. In detail, the writing of the resistance value to the at least one variable resistance device may include supplying a write current determined by at least one selected from the group consisting of the voltage and current of the input signal to the at least one variable resistance device.

In operation S120, when a read enable signal is activated, multi-level data corresponding to the resistance value written to the at least one variable resistance device is read by sensing the resistance value. In detail, the reading of the multi-level data may include supplying a read current determined not to influence the resistance value written to the at least one variable resistance device to the at least one variable resistance device.

As described above, according to the one or more example embodiments, a logic circuit may include a variable resistance device, a resistance value of which varies according to at least one selected from the group consisting of a voltage and current of an input signal, and latch multi-level data corresponding to the resistance value stored in the variable resistance device. As described above, the logic circuit may be manufactured in a simple manner by using the variable resistance device. Thus, even when the input signal is a multi-bit signal, latches for processing the bits included in the multi-bit signal, respectively, an analog-to-digital converter that processes an input signal, and a digital-to-analog convert that provides an output signal are not additionally needed. Accordingly, it is possible to reduce the size of and power consumption in the logic circuit.

Also, according to the one or more example embodiments, the variable resistance device included in the logic circuit may memorize the resistance value written thereto even when a power cutoff occurs. Thus, the logic circuit may be used as a non-volatile logic circuit. Accordingly, when power is supplied again, it is possible to rapidly read data from the logic circuit, thereby greatly improving an operating speed thereof.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:
1. A logic circuit comprising:
at least one variable resistance device configured such that a resistance value of the at least one variable resistance device varies according to at least one selected value, the selected value being selected from among a voltage and a current of an input signal, the at least one variable resistance device being configured to memorize the resistance value,
the logic circuit being configured to store multi-level data by setting the memorized resistance value; and a write unit including the at least one variable resistance device, a first write switch and a second write switch, the write unit being configured to write the multi-level data to the variable resistance device by setting the resistance value of the at least one variable resistance device based on the at least one selected value and a write enable signal, the variable resistance device including at least a first terminal and a second terminal, the first and second terminals being separate terminals, wherein the first write switch is connected to the variable resistance device via the first terminal, the first switch is configured such that a conductivity of the first write switch is controlled based on the write enable signal, the second write switch is connected to the variable resistance device via the second terminal, and the second switch is configured such that a conductivity of the second write switch is controlled based on the write enable signal.

2. The logic circuit of claim 1, wherein the input signal is a multi-bit signal.

3. The logic circuit of claim 1, further comprising:
a read unit configured to read the multi-level data corresponding to the set resistance value of the at least one variable resistance and a read enable signal.

4. The logic circuit of claim 3, wherein the write unit is configured such that if the write enable signal is activated, a current flowing through the at least one variable resistance device varies according to the at least one selected value.

5. The logic circuit of claim 3, wherein the write unit comprises:
a current supply unit connected between a first node and a second node, and configured to be switched on and to supply a write current to the second node based on the input signal,
wherein the first write switch is connected between a first power supply voltage terminal and a first node, and configured to be switched on in response to an inverted version of the write enable signal, the at least one variable resistance device is connected between the second node and a third node, and the second write switch is connected between the third node and a ground voltage terminal, and configured to be switched on in response to the write enable signal.

6. The logic circuit of claim 5, wherein, the read unit is configured such that if the read enable signal is activated, the read unit reads the multi-level data corresponding to the set resistance value of the at least one variable resistance device by sensing a voltage of the second node.

7. The logic circuit of claim 6, wherein the read unit comprises:
a first read switch connected between a second power supply voltage terminal and a fourth node, and configured to be switched on according to an inverted signal of the read enable signal;
a bias unit connected between the fourth node and the second node, and configured to be switched on and to supply a read current to the second node according to a bias signal; and
a second read switch connected between the third node and the ground voltage terminal, and configured to be switched on according to the read enable signal.

8. The logic circuit of claim 7, wherein the current supply unit includes a current supply switch, the bias unit includes a bias switch, and the current supply switch is larger than the bias switch.

9. The logic circuit of claim 7, wherein the bias unit comprises a bias switch, wherein a size of the bias switch is configured such that the bias switch does not to influence the set resistance value of the at least one variable resistance device.

10. The logic circuit of claim 5, wherein, the read unit is configured such that if the read enable signal is activated, the read unit reads the multi-level data corresponding to the set resistance value of the at least one variable resistance device by sensing a voltage of the third node.

11. The logic circuit of claim 10, wherein the read unit comprises:
a first read switch connected between a second power supply voltage terminal and the second node, and configured to be switched on based on an inverted signal of the read enable signal;
a bias unit connected between the third node and a fourth node, and configured to be switched on and to supply a read current to the third node based on a bias signal; and
a second read switch connected between the fourth node and the ground voltage terminal, and configured to be switched on based on the read enable signal.

12. The logic circuit of claim 11, wherein the current supply unit includes a current supply switch, the bias unit includes a bias switch, and the current supply switch is larger than the bias switch.

13. The logic circuit of claim 11, wherein the bias unit includes a bias switch, and a size of the bias switch is determined not to influence the resistance value written to the at least one variable resistance device.

14. The logic circuit of claim 3, wherein the write enable signal and the read enable signal are synchronized with a clock signal.

15. The logic circuit of claim 1, wherein the at least one variable resistance device includes at least one of a memristor and a resistive memory device.

16. A logic circuit comprising:
at least one variable resistance device configured such that a resistance value of the at least one variable resistance device varies according to at least one selected value, the selected value being selected from among a voltage and a current of an input signal, the at least one variable resistance device being configured to memorize the resistance value, the logic circuit being configured to store multi-level data by setting the memorized resistance value,
a write unit including the at least one variable resistance device, the write unit being configured to write the multi-level data to the variable resistance device by setting the resistance value of the at least one variable resistance device based on the at least one selected value and a write enable signal; and
a read unit configured to read the multi-level data corresponding to the set resistance value of the at least one variable resistance and a read enable signal,
wherein the write unit includes,
an input signal receiving unit connected between a first power supply voltage terminal and a plurality of input nodes, the input signal receiving unit being configured to activate one of the plurality of input nodes according to the input signal,
a first write switching unit connected between the plurality of input nodes and a ground voltage terminal, and configured to be switched on based on an inverted signal of the write enable signal,
a current supply unit connected between a second power supply voltage terminal and a first node, the current supply unit being configured to supply a write current to the first node based on an activated input node from among the plurality of input nodes, the at least one variable resistance device connected between the first node and a second nodes, and a second write switch connected between the second node and the ground voltage terminal, and configured to be switched on based on the write enable signal, wherein the current supply unit includes, a plurality of current adjustment devices commonly connected to the second power supply voltage terminal, and configured to be switched on according to voltages of the plurality of input nodes, respectively, sizes of the plurality of current adjustment devices being different from one another.

17. The logic circuit of claim 16, wherein the current supply unit comprises:

a plurality of switches commonly connected to the second power supply voltage terminal, and configured to be switched on based on voltages of the plurality of input nodes, respectively, wherein the plurality of current adjustment devices are connected in series to the plurality of switches, respectively, and configured to be switched on based on a first bias signal.

18. The logic circuit of claim 16, wherein the read unit is configured such that if the read enable signal is activated, the read unit reads the multi-level data corresponding to the set resistance value of the at least one variable resistance device by sensing a voltage of the first node.

19. The logic circuit of claim 18, wherein the read unit comprises:

a first read switch connected between a third power supply voltage terminal and a third node, and configured to be switched on based on an inverted signal of the read enable signal;

a bias unit connected between the third node and the first node, and configured to be switched on and to supply a read current to the first node based on a bias signal; and a second read switch connected between the second node and the ground voltage terminal, and configured to be switched on based on the read enable signal.

20. The logic circuit of claim 19, wherein the read unit further comprises a sense amplifier configured to generate a determination based on the voltage of the first node and a plurality of reference voltages that are different from one another, and to read the multi-level data based on the determination.

21. The logic circuit of claim 19, wherein the bias unit comprises:

a bias switch, a size of the bias switch being configured such that the bias switch does not influence the set resistance value of the at least one variable resistance device.

22. The logic circuit of claim 16, wherein, the read unit is configured such that if the read enable signal is activated, the read unit reads the multi-level data corresponding to the set resistance value of the at least one variable resistance device by sensing a voltage of the second node.

23. The logic circuit of claim 22, wherein the read unit comprises:

a first read switch connected between a third power supply voltage terminal and the first node, and configured to be switched on based on an inverted signal of the read enable signal;

a bias unit connected between the second node and a third node, and configured to be switched on based on a bias signal to supply a read current to the second node; and a second read switch connected between the third node and the ground voltage terminal, and configured to be switched on based on the read enable signal.

24. The logic circuit of claim 23, wherein the read unit further comprises:

a sense amplifier configured to generate a determination based on the voltage of the second node and a plurality of reference voltages that are different from one another to read the multi-level data based on the determination.

25. The logic circuit of claim 23, wherein the bias unit comprises:

a bias switch, a size of the bias switch being configured such that the bias switch does not to influence the set resistance value of the at least one variable resistance device.

26. An integrated circuit comprises:

a controller configured to produce a write enable signal and a read enable signal;

a write unit configured to receive the write enable signal; and a read unit configured to receive the read enable signal, wherein the write unit includes at least one variable resistance device configured such that a resistance value of the at least one variable resistance device varies according to at least one selected value, the selected value being selected from among a voltage and current of an input signal, the at least one variable resistance device being configured to memorize the resistance value, the write unit being configured to write multi-level data to the at least one variable resistance device by setting the resistance value based on the write enable signal, and wherein the read unit is configured to read the multi-level data corresponding to the set resistance value of the at least one variable resistance device, based on the read enable signal, the reading unit including, a first read switch connected between a first power supply voltage terminal and a first node, and configured to be switched on based on the read enable signal;

a bias unit connected between the first node and a second node, and configured to be switched on and to supply a read current to the second node according to a bias signal; and a second read switch connected between a third node and a ground voltage terminal, and configured to be switched on based on the read enable signal, and wherein the at least one variable resistance device is connected between the second node and a third node.

27. The logic circuit of claim 26, wherein the controller is configured to produce the write enable signal and the read enable signal in synchronization with a clock signal.

28. A method of operating a logic circuit that includes at least one variable resistance device that memorizes a resistance value, the resistance value varying according to at least one selected value, the selected value being selected from among a voltage and a current of an input signal, the method comprising:

setting the resistance value of the at least one variable resistance device based on the at least one selected value, if a write enable signal is activated; and reading multi-level data corresponding to the set resistance value of the at least one variable resistance device by sensing the resistance value, if a read enable signal is activated, wherein the at least one variable resistance device includes at least a first terminal and a second terminal, the first and second terminals being separate terminals, a first write switch is connected to the variable resistance device via the first terminal, and a second write switch is connected to the variable resistance device via the second terminal, and wherein the setting the resistance value includes changing a conductivity of the first write switch based on the write enable signal and changing a conductivity of the second write based on the write enable signal such that a write current flows between the first and second terminals of the variable resistance device.

29. The method of claim 28, wherein the setting of the resistance value to the at least one variable resistance device comprises:

supplying a write current to the at least one variable resistance device, wherein the write current is determined based on the at least one selected value.

30. The method of claim 28, wherein the reading of the multi-level data corresponding to the resistance value comprises:

supplying a read current to the at least one variable resistance device, wherein the read current is selected such that the read current does not influence the set resistance value of the at least one variable resistance device.

* * * * *